US006972601B2

(12) United States Patent
Kim

(10) Patent No.: US 6,972,601 B2
(45) Date of Patent: Dec. 6, 2005

(54) SENSE AMPLIFIER HAVING SYNCHRONOUS RESET OR ASYNCHRONOUS RESET CAPABILITY

(75) Inventor: Min-su Kim, Kyungki-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/627,855

(22) Filed: Jul. 25, 2003

(65) Prior Publication Data

US 2004/0160244 A1  Aug. 19, 2004

(30) Foreign Application Priority Data

Aug. 7, 2002 (KR) ...................... 10-2002-0046570

(51) Int. Cl.[7] ............................................ G01R 19/00
(52) U.S. Cl. ......................................... 327/52; 327/65
(58) Field of Search .............................. 327/51, 52, 54, 327/56, 65, 67

(56) References Cited

U.S. PATENT DOCUMENTS 5,317,212 A * 5/1994 Wahlstrom .................. 326/44
5,854,562 A * 12/1998 Toyoshima et al. ........... 327/55
6,201,418 B1 * 3/2001 Allmon ........................ 327/52
6,215,331 B1 * 4/2001 Setty et al. .................... 327/51
6,400,186 B1 * 6/2002 Bailey et al. .................. 327/55
6,633,188 B1 * 10/2003 Jia et al. ..................... 327/217
6,700,425 B1 * 3/2004 Pilling ........................ 327/291

* cited by examiner

Primary Examiner—Timothy P. Callahan
Assistant Examiner—Cassandra Cox
(74) Attorney, Agent, or Firm—Mills & Onello LLP

(57) ABSTRACT

A sense amplifier having a synchronous reset capability or an asynchronous reset capability, which is readily implemented and has high speed, is provided. The sense amplifier includes a first sense-amplifying unit which sense-amplifies an input signal in response to a clock signal and generates an output signal, and a second sense-amplifying unit which sense-amplifies a complementary signal of the input signal in response to the clock signal and generates a complementary signal of the output signal. The sense amplifier further includes a first controller which is connected to the first sense-amplifying unit and sets the output signal in response to a reset signal and an inverted signal of the reset signal, and a second controller which is connected to the second sense-amplifying unit and resets the complementary signal of the output signal in response to the reset signal and the inverted signal of the reset signal.

48 Claims, 4 Drawing Sheets

SENSE AMPLIFIER HAVING SYNCHRONOUS RESET OR ASYNCHRONOUS RESET CAPABILITY

BACKGROUND OF THE INVENTION

This application claims the priority of Korean Patent Application No. 2002-46570, filed on Aug. 7, 2002, in the Korean Intellectual Property Office, the contents of which are incorporated herein in their entirety by reference.

1. Field of the Invention

The present invention relates to a semiconductor integrated circuit (IC), and more particularly, to a sense amplifier having a synchronous reset or an asynchronous reset capability.

2. Description of the Related Art

In semiconductor integrated circuits (ICs), in particular, in semiconductor memory devices, data stored in a memory cell is read via a bit line pair and an input/output line pair. However, during a read operation, a voltage difference across a bitline pair and a voltage difference across an input/output line pair are very small. Thus, a sense amplifier is used to sense small the differences in voltages.

In high-speed processors, a latch having a synchronous reset capability or an asynchronous reset capability is generally used in a critical path. However, the latch introduces much delay time in the critical path, which is a limitation in-improving operating speed of a processor. Thus, in order to further improve the operating speed of the processor, a sense amplifier instead of the latch can be used in the critical path.

However, a conventional sense amplifier does not have a reset capability. Thus, there is a need for a sense amplifier having a synchronous reset capability or an asynchronous reset capability for use in integrated circuits (ICs) such as high-speed processors.

SUMMARY OF THE INVENTION

The present invention provides a sense amplifier having a synchronous reset capability, which can be readily implemented and has a high operating speed.

The present invention further provides a sense amplifier having an asynchronous reset capability, which can be readily implemented and has a high operating speed.

According to an aspect of the present invention, there is provided a sense amplifier having a synchronous reset capability. The sense amplifier includes a first sense-amplifying unit, a second sense-amplifying unit, a first controller, a second controller and a current source. The first sense-amplifying unit sense-amplifies an input signal in response to a clock signal and generates an output signal. The second sense-amplifying unit sense-amplifies a complementary signal of the input signal in response to the clock signal and generates a complementary signal of the output signal. The first controller is connected to the first sense-amplifying unit and sets the output signal in response to a reset signal and an inverted signal of the reset signal. The second controller is connected to the second sense-amplifying unit and resets the complementary signal of the output signal in response to the reset signal and the inverted signal of the reset signal. The current source is connected to the first sense-amplifying unit, the second sense-amplifying unit, the first controller and the second controller and responds to the clock signal.

According to another aspect of the present invention, there is provided a sense amplifier having an asynchronous reset capability. The sense amplifier having an asynchronous reset capability includes a first sense-amplifying unit, a second sense-amplifying unit, a first controller, a second controller and a current source. The first sense-amplifying unit sense-amplifies an input signal in response to a clock signal and a reset signal and generates an output signal. The second sense-amplifying unit sense-amplifies a complementary signal of the input signal in response to the clock signal and the reset signal and generates a complementary signal of the output signal. The first controller is connected to the first sense-amplifying unit and resets the output signal in response to the reset signal and an inverted signal of the reset signal. The second controller is connected to the second sense-amplifying unit and sets the complementary signal of the output signal in response to the reset signal and the inverted signal of the reset signal. The current source is connected to the first sense-amplifying unit, the second sense-amplifying unit, the first controller and the second controller and responds to the clock signal.

The sense amplifiers of the invention can include a first inverting buffer and a second inverting buffer. The first inverting buffer buffers and inverts the output signal. The second inverting buffer buffers and inverts the complementary signal of the output signal.

According to another aspect, the invention is directed to a sense amplifier comprising a first sense-amplifying unit which sense-amplifies an input signal in response to a clock signal and generates an output signal; a second sense-amplifying unit which sense-amplifies a complementary signal of the input signal in response to the clock signal and generates the complementary signal of the output signal; a controller which is connected to the first sense-amplifying unit and the second sense-amplifying unit, sets the output signal and resets the complementary signal of the output signal in response to a reset signal and an inverted signal of the reset signal; and a current source which is connected to the first sense-amplifying unit, the second sense-amplifying unit, the first controller, and the second controller and responds to the clock signal.

According to another aspect, the invention is directed to a sense amplifier comprising a first sense-amplifying unit which sense-amplifies an input signal in response to a clock signal and generates an output signal; a second sense-amplifying unit which sense-amplifies a complementary signal of the input signal in response to the clock signal and generates a complementary signal of the output signal; a controller which is connected to the first sense-amplifying unit and the second sense-amplifying unit, resets the output signal and sets the complementary signal of the output signal in response to a reset signal and an inverted signal of the reset signal; and a current source which is connected to the first sense-amplifying unit, the second sense-amplifying unit, the first controller, and the second controller and responds to the clock signal.

According to another aspect, the invention is directed to a sense amplifier comprising a first sense-amplifying unit which sense-amplifies an input signal in response to a clock signal and a reset signal and generates an output signal; a second sense-amplifying unit which sense-amplifies a complementary signal of the input signal in response to the clock signal and the reset signal and generates a complementary signal of the output signal; a first controller which is connected to the first sense-amplifying unit and sets the output signal in response to the reset signal and an inverted signal of the reset signal; and a second controller which is connected to the second sense-amplifying unit and resets the complementary signal of the output signal in response to the reset signal and the inverted signal of the reset signal.

According to another aspect, the invention is directed to a sense amplifier comprising a first sense-amplifying unit which sense-amplifies an input signal in response to a clock signal and a reset signal and generates an output signal; a second sense-amplifying unit which sense-amplifies a complementary signal of the input signal in response to the clock signal and the reset signal and generates a complementary signal of the output signal; a first controller which is connected to the first sense-amplifying unit and resets the output signal in response to the reset signal and an inverted signal of the reset signal; and a second controller which is connected to the second sense-amplifying unit and sets the complementary signal of the output signal in response to the reset signal and the inverted signal of the reset signal.

According to another aspect, the invention is directed to a sense amplifier comprising a first sense-amplifying unit which sense-amplifies an input signal in response to a clock signal and a reset signal and generates an output signal; a second sense-amplifying unit which sense-amplifies a complementary signal of the input signal in response to the clock signal and the reset signal and generates a complementary signal of the output signal; and a controller which is connected to the first sense-amplifying unit and the second sense-amplifying unit, sets the output signal and resets the complementary signal of the output signal in response to the reset signal and an inverted signal of the reset signal.

According to another aspect, the invention is directed to a sense amplifier comprising a first sense-amplifying unit which sense-amplifies an input signal in response to a clock signal and a reset signal and generates an output signal; a second sense-amplifying unit which sense-amplifies a complementary signal of the input signal in response to the clock signal and the reset signal and generates a complementary signal of the output signal; and a controller which is connected to the first sense-amplifying unit and the second sense-amplifying unit, resets the output signal and sets the complementary signal of the output signal in response to the reset signal and an inverted signal of the reset signal.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
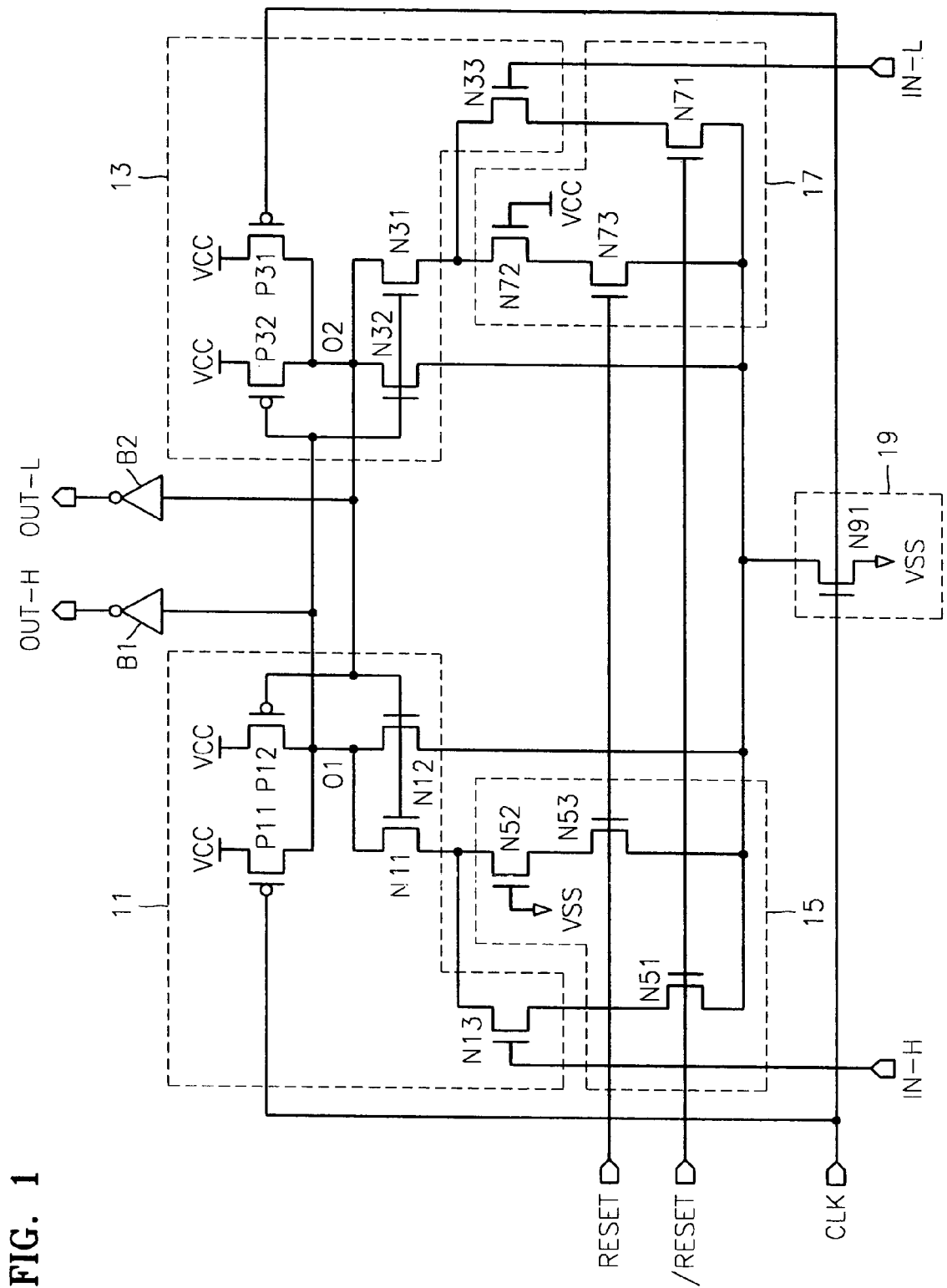
FIG. 1 shows a circuit diagram illustrating a first embodiment of a sense amplifier having a synchronous reset capability according to the present invention.

FIG. 1 shows a circuit diagram illustrating a first embodiment of a sense amplifier having a synchronous reset capability according to the present invention. Referring to FIG. 1, the sense amplifier having a synchronous reset capability according to the first embodiment of the present invention includes a first sense-amplifying unit 11, a second sense-amplifying unit 13, a first controller 15, a second controller 17, a current source 19, a first inverting buffer B1, and a second inverting buffer B2.

The first sense-amplifying unit 11 sense-amplifies an input signal IN-H in response to a control signal CLK and outputs an output signal through a first output node O1. The second sense-amplifying unit 13 sense-amplifies a complementary input signal IN-L in response to the clock signal CLK and outputs a complementary signal of the output signal through a second output node O2. The first inverting buffer B1 buffers and inverts the signal of the first output node O1 and generates a final output signal OUT-H. The second inverting buffer B2 buffers and inverts the signal of the second output node O2 and generates a complementary final output signal OUT-L.

The first controller 15 is connected to the first sense-amplifying unit 11 and sets the signal of the first output node O1 to logic "high" in response to a reset signal RESET and an inverted reset signal /RESET. That is, the first controller 15 resets the final output signal OUT-H to logic "low". The second controller 17 is connected to the second sense-amplifying unit 13 and resets the signal of the second output node O2 to logic "low" in response to the reset signal RESET and the inverted reset signal /RESET. That is, the second controller 17 sets the complementary final output signal OUT_L to logic "high". The current source 19 is connected to the first sense-amplifying unit 11, the second sense-amplifying unit 13, the first controller 15, and the second controller 17 and responds to the clock signal CLK.

The first sense-amplifying unit 11 includes PMOS transistors P11 and P12 and NMOS transistors N11 through N13. A power supply voltage VCC is applied to the source of the PMOS transistor P11, the clock signal CLK is applied to the gate of the PMOS transistor P11, and the drain of the PMOS transistor P11 is connected to the first output mode O1. The power supply voltage VCC is applied to the source of the PMOS transistor P12, the signal output from the second output node O2 of the second sense-amplifying unit 13 is applied to the gate of the PMOS transistor P12, and the drain of the PMOS transistor P12 is connected to the first output node O1.

The drain of the NMOS transistor N11 is connected to the first output node O1, the signal output from the second output node O2 is applied to the gate of the NMOS transistor N11, and the source of the NMOS transistor N11 is connected to the first controller 15. The drain of the NMOS transistor N12 is connected to the first output node O1, the signal output from the second output node O2 is applied to the gate of the NMOS transistor N12, and the source of the NMOS transistor N12 is connected to the current source 19. The drain of the NMOS transistor N13 is connected to the source of the NMOS transistor N11, the input signal IN-H is applied to the gate of the NMOS transistor N13, and the source of the NMOS transistor N13 is connected to the first controller 15.

The second sense-amplifying unit 13 includes PMOS transistors P31 and P32 and NMOS transistors N31 through N33. The power supply voltage VCC is applied to the source of the PMOS transistor P31, the clock signal CLK is applied to the gate of the PMOS transistor P31, and the drain of the PMOS transistor P31 is connected to the second output node O2. The power supply voltage VCC is applied to the source of the PMOS transistor P32, the signal output from the first output node O1 of the first sense-amplifying unit 11 is applied to the gate of the PMOS transistor P32, and the drain of the PMOS transistor P32 is connected to the second output node O2.

The drain of the NMOS transistor N31 is connected to the second output node O2, the signal output from the first output node O1 is applied to the gate of the NMOS transistor N31, and the source of the NMOS transistor N31 is connected to the second controller 17. The drain of the NMOS transistor N32 is connected to the second output node O2, the signal output from the first output node O1 is applied to the gate of the NMOS transistor N32, and the source of the NMOS transistor N32 is connected to the current source 19. The drain of the NMOS transistor N33 is connected to the source of the NMOS transistor N31, the complementary input signal IN-L is applied to the gate of the NMOS transistor N33, and the source of the NMOS transistor N33 is connected to the second controller 17.

The first controller 15 includes NMOS transistors N51 through N53. The drain of the NMOS transistor N51 is connected to the first sense-amplifying unit 11, the inverted reset signal /RESET is applied to the gate of the NMOS transistor N51, and the source of the NMOS transistor N51 is applied to the current source 19.

The drain of the NMOS transistor N52 is connected to the first sense-amplifying unit 11, and the ground voltage VSS is applied to the gate of the NMOS transistor N52. The drain of the NMOS transistor N53 is connected to the source of the NMOS transistor N52, the reset signal RESET is applied to the gate of the NMOS transistor N53, and the source of the NMOS transistor N53 is connected to the current source 19.

The second controller 17 includes NMOS transistors N71 through N73. The drain of the NMOS transistor N71 is connected to the second sense-amplifying unit 13, the inverted reset signal /RESET is applied to the gate of the NMOS transistor N71, and the source of the NMOS transistor N71 is applied to the current source 19.

The drain of the NMOS transistor N72 is connected to the second sense-amplifying unit 13, and the power supply voltage VCC is applied to the gate of the NMOS transistor N72. The drain of the NMOS transistor N73 is connected to the source of the NMOS transistor N72, the reset signal RESET is applied to the gate of the NMOS transistor N73, and the source of the NMOS transistor N73 is connected to the current source 19.

The current source 19 includes an NMOS transistor N91. The drain of the NMOS transistor N91 is commonly connected to the first sense-amplifying unit 11, the second sense-amplifying unit 13, the first controller 15, and the second controller 17, the clock signal CLK is applied to the gate of the NMOS transistor N91, and the ground voltage VSS is applied to the source of the NMOS transistor N91.

The operation of the sense amplifier having the synchronous reset capability according to the first embodiment of the present invention shown in FIG. 1 will be described in greater detail.

When the reset signal RESET is disabled to logic "low", the NMOS transistor N53 of the first controller 15 and the NMOS transistor N73 of the second controller 17 are turned off, and the NMOS transistor N51 of the first controller 15 and the NMOS transistor N71 of the second controller 17 are turned on. Thus, the sense amplifier performs a normal operation, sense-amplifies the input signal IN-H and the complementary input signal IN-L in response to the clock signal CLK, and generates the final output signal OUT-H and the complementary output signal OUT-L.

When the reset signal RESET is enabled to logic "high", the NMOS transistor N53 of the first controller 15 and the NMOS transistor N73 of the second controller 17 are turned on, and the NMOS transistor N51 of the first controller 15 and the NMOS transistor N71 of the second controller 17 are turned off. Thus, the sense amplifier does not receive the input signal IN-H and the complementary input signal IN-L, and the values of the final output signal OUT-H and the complementary output signal OUT-L are determined by a value predetermined by the NMOS transistor N52 of the first controller 15 and a value predetermined by the NMOS transistor N72 of the second controller 17, respectively. That is, the ground voltage VSS is applied to the gate of the NMOS transistor N52, and thus the NMOS transistor N52 is turned off, and the power supply voltage VCC is applied to the gate of the NMOS transistor N72, and thus the NMOS transistor N72 is turned on. In this state, in response to the clock signal CLK, the signal of the first output node O1 is set to logic "high", and the signal of the second output node O2 is reset to logic "low". As a result, the final output signal OUT-H is reset to logic "low", and the complementary final output signal OUT-L is set to logic "high". In this way, the sense amplifier shown in FIG. 1 is synchronously reset in response to the clock signal CLK.

In a variation of the first embodiment of the sense amplifier having the synchronous reset capability, the power supply voltage VCC is applied to the gate of the NMOS transistor N52 of the first controller 15 and the ground voltage VSS is applied to the gate of the NMOS transistor N72 of the second controller 17, so that the signal of the first output node O1 is reset to logic "low", and the signal of the second output node O2 is set to logic "high". As a result, the final output signal OUT-H is set to logic "high", and the complementary final output signal OUT-L is reset to logic "low".

Figure 2:
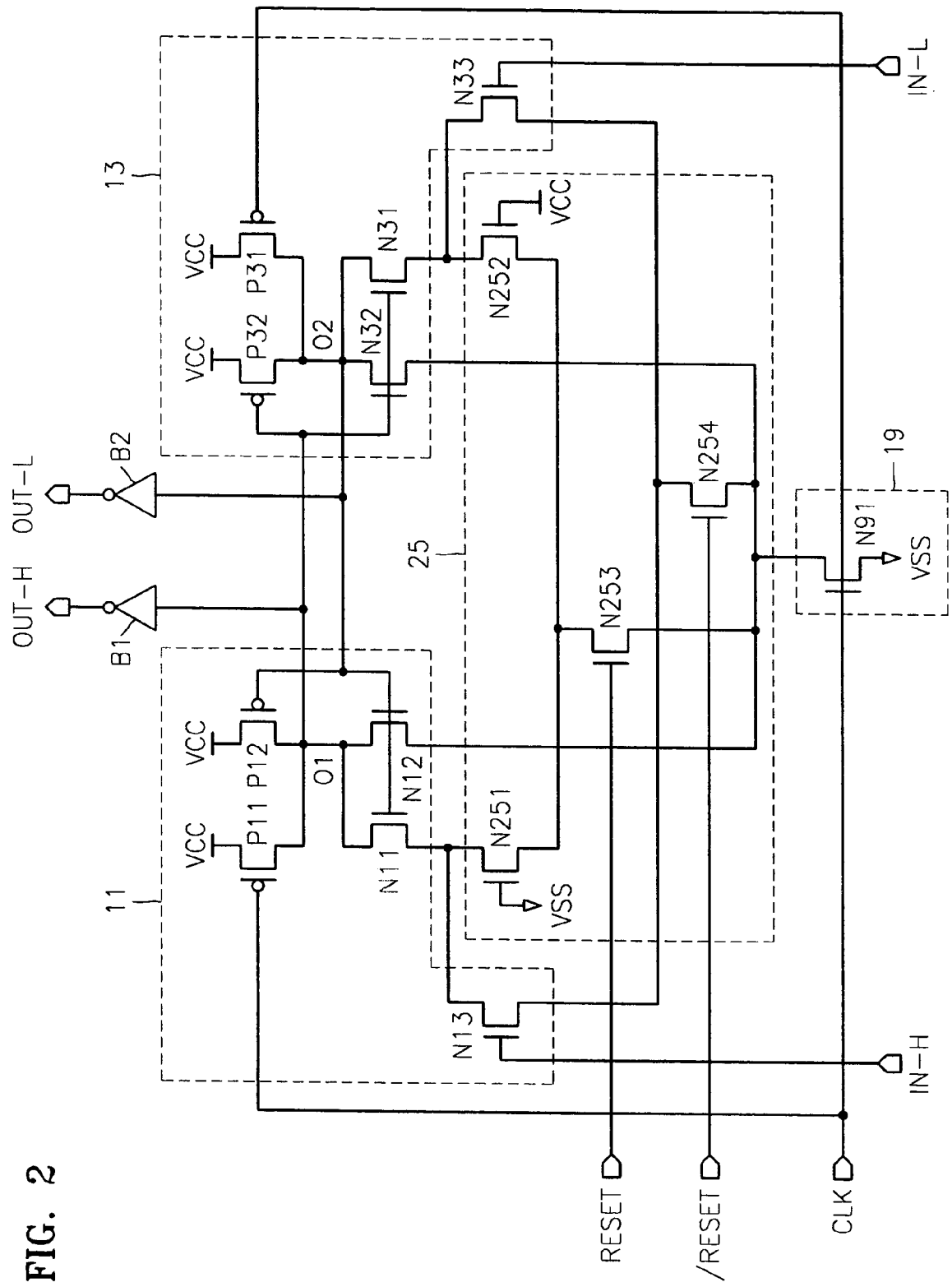
FIG. 2 shows a circuit diagram illustrating a second embodiment of the sense amplifier having a synchronous reset capability according to the present invention.

FIG. 2 shows a circuit diagram illustrating a second embodiment of a sense amplifier having a synchronous reset capability according to the present invention. Referring to FIG. 2, the sense amplifier having the synchronous reset capability according to the second embodiment of the present invention includes a first sense-amplifying unit 11, a second sense-amplifying unit 13, a controller 25, a current source 19, a first inverting buffer B1, and a second inverting buffer B2.

The first sense-amplifying unit 11, the second sense-amplifying unit 13, the current source 19, the first inverting buffer B1, and the second inverting buffer B2 are the same as those shown in FIG. 1.

The controller 25 is a combination of the first controller 15 and the second controller 17 shown in FIG. 1. The controller 25 is connected to the first sense-amplifying unit 11 and the second sense-amplifying unit 13, and sets the signal of the first output node O1 to logic "high" in response to a reset signal RESET and an inverted reset signal /RESET. That is, the controller 25 resets the final output signal OUT-H to logic "low" and sets the complementary final output signal OUT-L to logic "high".

The controller 25 includes NMOS transistors N251 through N254. The drain of the NMOS transistor N251 is connected to the first sense-amplifying unit 11, and a ground voltage VSS is applied to the gate of the NMOS transistor N251. The drain of the NMOS transistor N252 is connected to the second sense-amplifying unit 13, and the power supply voltage VCC is applied to the gate of the NMOS transistor N252. The drain of the NMOS transistor N253 is commonly connected to the source of the NMOS transistor N251 and the source of the NMOS transistor N252, the reset signal RESET is applied to the gate of the NMOS transistor N253, and the source of the NMOS transistor N253 is connected to the current source 19. The drain of the NMOS transistor N254 is commonly connected to the first sense-amplifying unit 11 and the second sense-amplifying unit 13, the inverted reset signal/RESET is applied to the gate of the NMOS transistor N254, and the source of the NMOS transistor N254 is connected to the current source 19.

The operation of the sense amplifier having the synchronous reset capability according to the second embodiment of the present invention is the same as that shown in FIG. 1. That is, when the reset signal RESET is enabled to logic "high", the NMOS transistor N253 of the controller 25 is turned on, and the NMOS transistor N254 of the controller 25 is turned off. Thus, the sense amplifier does not receive the input signal IN-H and the complementary input signal IN-L, and values of the final output signal OUT-H and the complementary output signal OUT-L are determined by a value predetermined by the NMOS transistor N251 of the controller 25 and a value predetermined by the NMOS transistor N252 of the controller 25, respectively. That is, the ground voltage VSS is applied to the gate of the NMOS transistor N251, and thus the NMOS transistor N251 is turned off, and the power supply voltage VCC is applied to the gate of the NMOS transistor N252, and thus the NMOS transistor N252 is turned on. In this state, the signal of the first output node O1 is set to logic "high", and the signal of the second output node O2 is reset to logic "low". As a result, the final output signal OUT-H is reset to logic "low", and the complementary final output signal OUT-L is set to logic "high".

In a variation of the second embodiment of the sense amplifier having the synchronous reset capability, the power supply voltage VCC is applied to the gate of the NMOS transistor N251 of the controller 25 and the ground voltage VSS is applied to the gate of the NMOS transistor N252 of the controller 25, so that the signal of the first output node O1 is reset to logic "low" and the signal of the second output node O2 is set to logic "high". As a result, the final output signal OUT-H is set to logic "high", and the complementary final output signal OUT-L is reset to logic "low".

Figure 3:
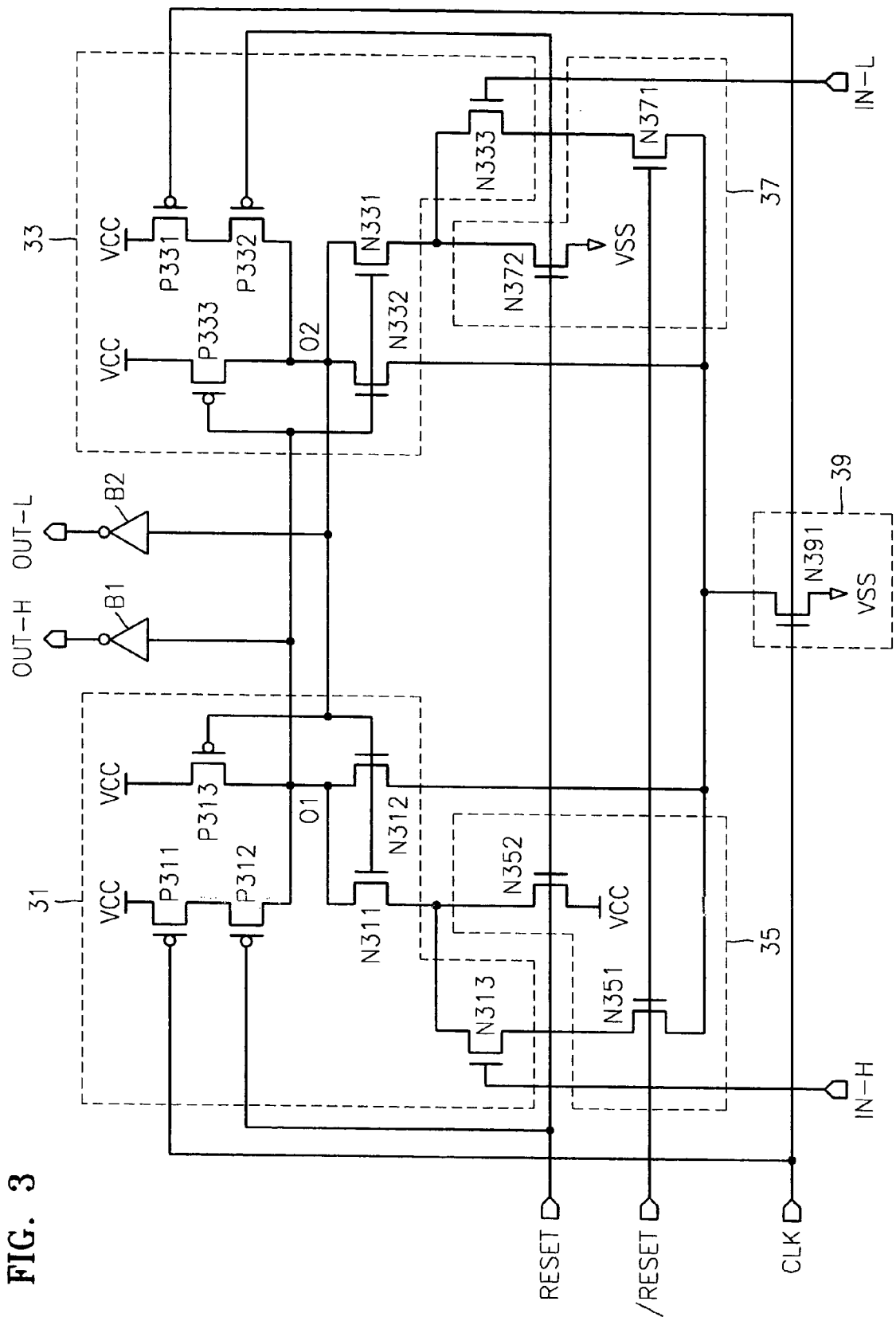
FIG. 3 shows a circuit diagram illustrating a first embodiment of a sense amplifier having an asynchronous reset capability according to the present invention.

FIG. 3 shows a circuit diagram illustrating a first embodiment of a sense amplifier having an asynchronous reset capability according to the present invention. Referring to FIG. 3, the sense amplifier having the asynchronous reset capability according to the first embodiment of the present invention includes a first sense-amplifying unit 31, a second sense-amplifying unit 33, a first controller 35, a second controller 37, a current source 39, a first inverting buffer B1, and a second inverting buffer B2.

The first sense-amplifying unit 31 sense-amplifies an input signal IN-H in response to a control signal CLK and a reset signal RESET and outputs an output signal through a first output node O1. The second sense-amplifying unit 33 sense-amplifies a complementary input signal IN-L in response to the clock signal CLK and the reset signal RESET and outputs a complementary output signal through a second output node O2. The first inverting buffer B1 buffers and inverts the signal of the first output node O1 and generates a final output signal OUT-H. The second inverting buffer B2 buffers and inverts the signal of the second output node O2 and generates a complementary final output signal OUT-L.

The first controller 35 is connected to the first sense-amplifying unit 31 and sets the signal of the first output node O1 to logic "high" in response to the reset signal RESET and an inverted reset signal/RESET. As a result, the final output signal OUT-H is set to logic "low". The second controller 37 is connected to the second sense-amplifying unit 33 and sets the signal of the second output node O2 to logic "low" in response to the reset signal RESET and the inverted reset signal /RESET. As a result, the complementary final output signal OUT_L is set to logic "high".

The first sense-amplifying unit 31 includes PMOS transistors P311 through P313 and NMOS transistors N311 through N313. The power supply voltage VCC is applied to the source of the PMOS transistor P311, and the clock signal CLK is applied to the gate of the PMOS transistor P311. The source of the PMOS transistor P312 is connected to the drain of the PMOS transistor P311, the reset signal RESET is applied to the gate of the PMOS transistor P312, and the drain of the PMOS transistor P312 is connected to the first output mode O1. The power supply voltage VCC is applied to the source of the PMOS transistor P313, the signal of the second output node O2 is applied to the gate of the PMOS transistor P313, and the drain of the PMOS transistor P313 is connected to the first output node O1. The drain of the NMOS transistor N311 is connected to the first output node O1, the signal of the second output node O2 is applied to the gate of the NMOS transistor N311, and the source of the NMOS transistor N311 is connected to the first controller 35. The drain of the NMOS transistor N312 is connected to the first output node O1, the signal of the second output node O2 is applied to the gate of the NMOS transistor N312, and the source of the NMOS transistor N312 is connected to the current source 39. The drain of the NMOS transistor N313 is connected to the source of the NMOS transistor N311, the input signal IN-H is applied to the gate of the NMOS transistor N313, and the source of the NMOS transistor N313 is connected to the first controller 35.

The second sense-amplifying unit 33 includes PMOS transistors P331 through P333 and NMOS transistors N331 through N333. The power supply voltage VCC is applied to the source of the PMOS transistor P331, and the clock signal CLK is applied to the gate of the PMOS transistor P331. The source of the PMOS transistor P332 is connected to the drain of the PMOS transistor P331, the reset signal RESET is applied to the gate of the PMOS transistor P332, and the drain of the PMOS transistor P332 is connected to the second output node O2. The power supply voltage VCC is applied to the source of the PMOS transistor P333, the signal of the first output node O1 is applied to the gate of the PMOS transistor P333, and the drain of the PMOS transistor P333 is connected to the second output node O2.

The drain of the NMOS transistor N331 is connected to the second output node O2, the signal of the first output node O1 is applied to the gate of the NMOS transistor N331, and the source of the NMOS transistor N331 is connected to the second controller 37. The drain of the NMOS transistor N332 is connected to the second output node O2, the signal of the first output node O1 is applied to the gate of the NMOS transistor N332, and the source of the NMOS transistor N332 is connected to the current source 39. The drain of the NMOS transistor N333 is connected to the source of the NMOS transistor N331, the complementary input signal IN-L is applied to the gate of the NMOS transistor N333, and the source of the NMOS transistor N333 is connected to the second controller 37.

The first controller 35 includes NMOS transistors N351 and N352. The drain of the NMOS transistor N351 is connected to the first sense-amplifying unit 31, the inverted reset signal/RESET is applied to the gate of the NMOS transistor N351, and the source of the NMOS transistor N351 is applied to the current source 39. The drain of the NMOS transistor N352 is connected to the first sense-amplifying unit 31, the reset signal RESET is applied to the gate of the NMOS transistor N352, and the power supply voltage VCC is applied to the source of the NMOS transistor N352.

The second controller 37 includes NMOS transistors N371 and N372. The drain of the NMOS transistor N371 is connected to the second sense-amplifying unit 33, the inverted reset signal/RESET is applied to the gate of the NMOS transistor N371, and the source of the NMOS transistor N371 is applied to the current source 39. The drain of the NMOS transistor N372 is connected to the second sense-amplifying unit 33, the reset signal RESET is applied to the gate of the NMOS transistor N372, and the ground voltage VSS is applied to the source of the NMOS transistor N372.

The current source 39 includes an NMOS transistor N391. The drain of the NMOS transistor N391 is commonly connected to the first sense-amplifying unit 31, the second sense-amplifying unit 33, the first controller 35, and the second controller 37, the clock signal CLK is applied to the gate of the NMOS transistor N391, and the ground voltage VSS is applied to the source of the NMOS transistor N391.

The operation of the sense amplifier having an asynchronous reset capability according to the first embodiment of the present invention shown in FIG. 3 will be described in greater detail.

The PMOS transistor P312 of the first sense-amplifying unit 31 and the PMOS transistor P332 of the second sense-amplifying unit 33 are turned on when the reset signal RESET is disabled to logic "low" such that the sense amplifier performs a normal operation. The NMOS transistor N352 of the first controller 35 and the NMOS transistor N372 of the second controller 37 are turned on when the reset signal RESET is enabled to logic "high", and thus values of the final output signal OUT-H and the complementary output signal OUT-L are determined regardless of the clock signal CLK by a value predetermined by the NMOS transistor N352 and a value predetermined by the NMOS transistor N372, respectively. That is, the power supply voltage VCC is applied to the source of the NMOS transistor N352, and the ground voltage VSS is applied to the source of the NMOS transistor N372, and thus, regardless of the clock signal CLK, the signal of the first output node O1 is set to logic "high", and the signal of the second output node O2 is reset to logic "low". As a result, the final output signal OUT-H is reset to logic "low", and the complementary final output signal OUT-L is set to logic "high". In this way, the sense amplifier shown in FIG. 3 is asynchronously reset regardless of the clock signal CLK.

In a variation of the first embodiment of the sense amplifier having the asynchronous reset capability, when the ground voltage VSS is applied to the source of the NMOS transistor N352 and the power supply voltage VCC is applied to the source of the NMOS transistor N372, the signal of the first output node O1 is reset to logic "low", and the signal of the second output node O2 is set to logic "high". As a result, the final output signal OUT-H is set to logic "high", and the complementary final output signal OUT-L is reset to logic "low".

Figure 4:
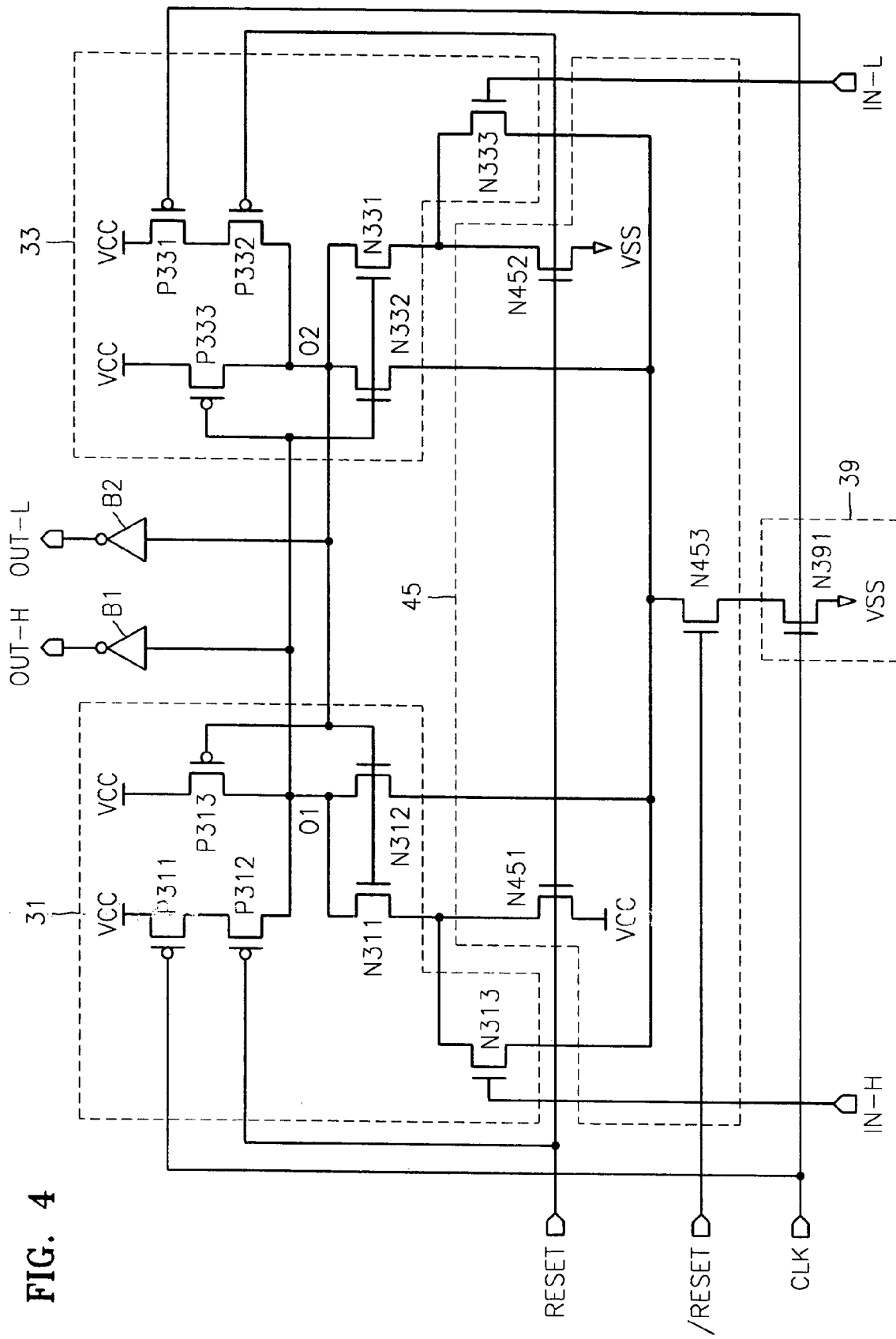
FIG. 4 shows a circuit diagram illustrating a second embodiment of the sense amplifier having an asynchronous reset capability according to the present invention.

FIG. 4 shows a circuit diagram illustrating a second embodiment of a sense amplifier having an asynchronous reset capability according to the present invention. Referring to FIG. 4, the sense amplifier having the asynchronous reset capability according to the second embodiment of the present invention includes a first sense-amplifying unit 31, a second sense-amplifying unit 33, a controller 45, a current source 39, a first inverting buffer B1, and a second inverting buffer B2.

The first sense-amplifying unit 31, the second sense-amplifying unit 33, the current source 39, the first inverting buffer B1, and the second inverting buffer B2 are the same as those shown in FIG. 3.

The controller 45 is combination of the first controller 35 and the second controller 37 show in FIG. 3 and is connected to the first sense-amplifying unit 31 and the second sense-amplifying unit 33. The controller 45 sets the signal of the first output node O1 to logic "high" in response to a reset signal RESET and an inverted reset signal /RESET, and resets the signal of the second output node O2 to logic "low". As a result, the final output signal OUT-H is reset to logic "low" and the complementary final output signal OUT-L is set to logic "high".

The controller 45 includes NMOS transistors N451 through N453. The drain of the NMOS transistor N451 is connected to the first sense-amplifying unit 31, the reset signal RESET is applied to the gate of the NMOS transistor N451, and a power supply voltage VCC is applied to the source of the NMOS transistor N451. The drain of the NMOS transistor N452 is connected to the second sense-amplifying unit 33, the reset signal RESET is applied to the gate of the NMOS transistor N452, and a ground voltage VSS is applied to the source of the NMOS transistor N452. The drain of the NMOS transistor N453 is commonly connected to the first sense-amplifying unit 31 and the second sense-amplifying unit 33, and the inverted reset signal/RESET is applied to the gate of the NMOS transistor N453.

The operation of the sense amplifier having the asynchronous reset capability according to the second embodiment of the present invention is the same as that shown in FIG. 3. That is, the sense amplifier having the asynchronous reset capability according to the second embodiment of the present invention is asynchronously reset regardless of the clock signal CLK. Specifically, the power supply voltage VCC is applied to the source of the NMOS transistor N451, and the ground voltage VSS is applied to the source of the NMOS transistor N452, and thus regardless of the clock signal CLK, the signal of the first output node O1 is set to logic "high", and the signal of the second output node O2 is reset to logic "low". As a result, the final output signal OUT-H is reset to logic "low", and the complementary final output signal OUT-L is set to logic "high".

In a variation of the first embodiment of the sense amplifier having the asynchronous reset capability, when the ground voltage VSS is applied to the source of the NMOS transistor N451 and the power supply voltage VCC is applied to the source of the NMOS transistor N452, the signal of the first output node O1 is reset to logic "low", and the signal of the second output node O2 is set to logic "high". As a result, the final output signal OUT-H is set to logic "high", and the complementary final output signal OUT-L is reset to logic "low".

As described above, in the sense amplifier according to the present invention having a synchronous rest capability or an asynchronous reset capability, a reset circuit is added to a conventional high-speed sense amplifier such that the sense amplifier can be readily implemented and has a high operating speed. Thus, instead of a latch having a synchronous reset capability or an asynchronous reset capability, the sense amplifier having the synchronous reset capability or the asynchronous reset capability according to the present invention can be used in a critical path of a processor so as to improve the processor's operating speed.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A sense amplifier comprising:
   a first sense-amplifying unit which sense-amplifies an input signal in response to a clock signal and generates an output signal;
   a second sense-amplifying unit which sense-amplifies a complementary signal of the input signal in response to the clock signal and generates a complementary signal of the output signal;
   a first controller which is connected to the first sense-amplifying unit and sets the output signal in response to a reset signal and an inverted signal of the reset signal;
   a second controller which is connected to the second sense-amplifying unit and resets the complementary signal of the output signal in response to the reset signal and the inverted signal of the reset signal; and
   a current source which is connected to the first sense-amplifying unit, the second sense-amplifying unit, the first controller, and the second controller and responds to the clock signal.

2. The sense amplifier of claim 1, further comprising:
   a first inverting buffer which buffers and inverts the output signal; and
   a second inverting buffer which buffers and inverts the complementary signal of the output signal.

3. The sense amplifier of claim 1, wherein the first sense-amplifying unit comprises:
   a first PMOS transistor, wherein a power supply voltage is applied to the source of the first PMOS transistor, the clock signal is applied to the gate of the first PMOS transistor, and the drain of the first PMOS transistor is connected to a first output node from which the output signal is output;
   a second PMOS transistor, wherein the power supply voltage is applied to the source of the second PMOS transistor, the complementary signal of the output signal output from the second sense-amplifying unit is applied to the gate of the second PMOS transistor, and the drain of the second PMOS transistor is connected to the first output node;
   a first NMOS transistor, wherein the drain of the first NMOS transistor is connected to the first output node, the complementary signal of the output signal is applied to the gate of the first NMOS transistor, and the source of the first NMOS transistor is connected to the first controller;
   a second NMOS transistor, wherein the drain of the second NMOS transistor is connected to the first output node, the complementary signal of the output signal is applied to the gate of the second NMOS transistor, and the source of the second NMOS transistor is connected to the current source; and
   a third NMOS transistor, wherein the drain of the third NMOS transistor is connected to the source of the first NMOS transistor, the input signal is applied to the gate of the third NMOS transistor, and the source of the third NMOS transistor is connected to the first controller.

4. The sense amplifier of claim 1, wherein the second sense-amplifying unit comprises:
   a first PMOS transistor, wherein a power supply voltage is applied to the source of the first PMOS transistor, the clock signal is applied to the gate of the first PMOS transistor, and the drain of the first PMOS transistor is connected to a second output node from which the complementary signal of the output signal is output;
   a second PMOS transistor, wherein the power supply voltage is applied to the source of the second PMOS transistor, the output signal output from the first sense-amplifying unit is applied to the gate of the second PMOS transistor, and the drain of the second PMOS transistor is connected to the second output node;
   a first NMOS transistor, wherein the drain of the first NMOS transistor is connected to the second output node, the output signal is applied to the gate of the first NMOS transistor, and the source of the first NMOS transistor is connected to the second controller;
   a second NMOS transistor, wherein the drain of the second NMOS transistor is connected to the second output node, the output signal is applied to the gate of the second NMOS transistor, and the source of the second NMOS transistor is connected to the current source; and
   a third NMOS transistor, wherein the drain of the third NMOS transistor is connected to the source of the first NMOS transistor, the complementary signal of the input signal is applied to the gate of the third NMOS transistor, and the source of the third NMOS transistor is connected to the second controller.

5. The sense amplifier of claim 1, wherein the first controller comprises:
   a first NMOS transistor, wherein the drain of the first NMOS transistor is connected to the first sense-amplifying unit, the inverted signal of the reset signal is applied to the gate of the first NMOS transistor, and the source of the first NMOS transistor is connected to the current source;
   a second NMOS transistor, wherein the drain of the second NMOS transistor is connected to the first sense-amplifying unit, and the ground voltage is applied to the gate of the second NMOS transistor; and
   a third NMOS transistor, wherein the drain of the third NMOS transistor is connected to the source of the second NMOS transistor, the reset signal is applied to the gate of the third NMOS transistor, and the source of the third NMOS transistor is connected to the current source.

6. The sense amplifier of claim 1, wherein the second controller comprises:
   a first NMOS transistor, wherein the drain of the first NMOS transistor is connected to the second sense-amplifying unit, the inverted signal of the reset signal is applied to the gate of the first NMOS transistor, and the source of the first NMOS transistor is connected to the current source;
   a second NMOS transistor, wherein the drain of the second NMOS transistor is connected to the second sense-amplifying unit, and the power supply voltage is applied to the gate of the second NMOS transistor; and
   a third NMOS transistor, wherein the drain of the third NMOS transistor is connected to the source of the second NMOS transistor, the reset signal is applied to the gate of the third NMOS transistor, and the source of the third NMOS transistor is connected to the current source.

7. The sense amplifier of claim 1, wherein the current source includes an NMOS transistor, wherein the drain of the NMOS transistor is commonly connected to the first sense-amplifying unit, the second sense-amplifying unit, the first controller, and the second controller, and the clock signal is applied to the gate of the NMOS transistor, and the ground voltage is applied to the source of the NMOS transistor.

8. A sense amplifier comprising: a first sense-amplifying unit which sense-amplifies an input signal in response to a clock signal and generates an output signal;
   a second sense-amplifying unit which sense-amplifies a complementary signal of the input signal in response to the clock signal and generates a complementary signal of the output signal;
   a first controller which is connected to the first sense-amplifying unit and resets the output signal in response to a reset signal and an inverted signal of the reset signal;
   a second controller which is connected to the second sense-amplifying unit and sets the complementary signal of the output signal in response to the reset signal and the inverted signal of the reset signal; and
   a current source which is connected to the first sense-amplifying unit, the second sense-amplifying unit, the first controller, and the second controller and responds to the clock signal.

9. The sense amplifier of claim 8, further comprising:
   a first inverting buffer which buffers and inverts the output signal; and
   a second inverting buffer which buffers and inverts the complementary signal of the output signal.

10. The sense amplifier of claim 8, wherein the first sense-amplifying unit comprises:
    a first PMOS transistor, wherein a power supply voltage is applied to the source of the first PMOS transistor, the clock signal is applied to the gate of the first PMOS transistor, and the drain of the first PMOS transistor is connected to a first output node from which the output signal is output;
    a second PMOS transistor, wherein the power supply voltage is applied to the source of the second PMOS transistor, the complementary signal of the output signal output from the second sense-amplifying unit is applied to the gate of the second PMOS transistor, and the drain of the second PMOS transistor is connected to the first output node;
    a first PMOS transistor, wherein the drain of the first NMOS transistor is connected to the first output node, the complementary signal of the output signal is applied to the gate of the first NMOS transistor, and the source of the first NMOS transistor is connected to the first controller;
    a second NMOS transistor, wherein the drain of the second NMOS transistor is connected to the first output node, the complementary signal of the output signal is applied to the gate of the second NMOS transistor, and the source of the second NMOS transistor is connected to the current source; and
    a third NMOS transistor, wherein the drain of the third NMOS transistor is connected to the source of the first NMOS transistor, the input signal is applied to the gate of the third NMOS transistor, and the source of the third NMOS transistor is connected to the first controller.

11. The sense amplifier of claim 8, wherein the second sense-amplifying unit comprises:
    a first PMOS transistor, wherein a power supply voltage is applied to the source of the first PMOS transistor, the clock signal is applied to the gate of the first PMOS transistor, and the drain of the first PMOS transistor is connected to a second output node from which the complementary signal of the output signal is output;
    a second PMOS transistor, wherein the power supply voltage is applied to the source of the second PMOS transistor, the output signal output from the first sense-amplifying unit is applied to the gate of the second PMOS transistor, and the drain of the second PMOS transistor is connected to the second output node;
    a first NMOS transistor, wherein the drain of the first NMOS transistor is connected to the second output node, the output signal is applied to the gate of the first NMOS transistor, and the source of the first NMOS transistor is connected to the second controller;
    a second NMOS transistor, wherein the drain of the second NMOS transistor is connected to the second output node, the output signal is applied to the gate of the second NMOS transistor, and the source of the second NMOS transistor is connected to the current source; and
    a third NMOS transistor, wherein the drain of the third NMOS transistor is connected to the source of the first NMOS transistor, the complementary signal of the input signal is applied to the gate of the third NMOS transistor, and the source of the third NMOS transistor is connected to the second controller.

12. The sense amplifier of claim 8, wherein the first controller comprises:
    a first NMOS transistor, wherein the drain of the first NMOS transistor is connected to the first sense-amplifying unit, the inverted signal of the reset signal is applied to the gate of the first NMOS transistor, and the source of the first NMOS transistor is connected to the current source;
    a second NMOS transistor, wherein the drain of the second NMOS transistor is connected to the first sense-amplifying unit, and the power supply voltage is applied to the gate of the second NMOS transistor; and
    a third NMOS transistor, wherein the drain of the third NMOS transistor is connected to the source of the second NMOS transistor, the reset signal is applied to the gate of the third NMOS transistor, and the source of the third NMOS transistor is connected to the current source.

13. The sense amplifier of claim 8, wherein the second controller comprises:
    a first NMOS transistor, wherein the drain of the first NMOS transistor is connected to the second sense-amplifying unit, the inverted signal of the reset signal is applied to the gate of the first NMOS transistor, and the source of the first NMOS transistor is connected to the current source;
    a second NMOS transistor, wherein the drain of the second NMOS transistor is connected to the second sense-amplifying unit, and the ground voltage is applied to the gate of the second NMOS transistor; and
    a third NMOS transistor, wherein the drain of the third NMOS transistor is connected to the source of the second NMOS transistor, the reset signal is applied to the gate of the third NMOS transistor, and the source of the third NMOS transistor is connected to the current source.

14. The sense amplifier of claim 8, wherein the current source includes an NMOS transistor, wherein the drain of the NMOS transistor is commonly connected to the first sense-amplifying unit, the second sense-amplifying unit, the first controller, and the second controller, and the clock signal is applied to the gate of the NMOS transistor, and the ground voltage is applied to the source of the NMOS transistor.

15. A sense amplifier comprising:
a first sense-amplifying unit which sense-amplifies an input signal in response to a clock signal and generates an output signal;
a second sense-amplifying unit which sense-amplifies a complementary signal of the input signal in response to the clock signal and generates the complementary signal of the output signal;
a controller which is connected to the first sense-amplifying unit and the second sense-amplifying unit, sets the output signal and resets the complementary signal of the output signal in response to a reset signal and an inverted signal of the reset signal; and
a current source which is connected to the first sense-amplifying unit, the second sense-amplifying unit, and the controller and responds to the clock signal; wherein the first sense-amplifying unit comprises:
a first PMOS transistor, wherein a power supply voltage is applied to the source of the first PMOS transistor, the clock signal is applied to the gate of the first PMOS transistor, and the drain of the first PMOS transistor is connected to a first output node from which the output signal is output;
a second PMOS transistor, wherein the power supply voltage is applied to the source of the second PMOS transistor, the complementary signal of the output signal output from the second sense-amplifying unit is applied to the gate of the second PMOS transistor, and the drain of the second PMOS transistor is connected to the first output node;
a first NMOS transistor, wherein the drain of the first NMOS transistor is connected to the first output node, the complementary signal of the output signal is applied to the gate of the first NMOS transistor, and the source of the first NMOS transistor is connected to the controller;
a second NMOS transistor, wherein the drain of the second NMOS transistor is connected to the first output node, the complementary signal of the output signal is applied to the gate of the second NMOS transistor, and the source of the second NMOS transistor is connected to the current source; and
a third NMOS transistor, wherein the drain of the third NMOS transistor is connected to the source of the first NMOS transistor, the input signal is applied to the gate of the third NMOS transistor, and the source of the third NMOS transistor is connected to the controller.

16. The sense amplifier of claim 15, further comprising:
a first inverting buffer which buffers and inverts the output signal; and
a second inverting buffer which buffers and inverts the complementary signal of the output signal.

17. A sense amplifier comprising:
a first sense-amplifying unit which sense-amplifies an input signal in response to a clock signal and generates an output signal;
a second sense-amplifying unit which sense-amplifies a complementary signal of the input signal in response to the clock signal and generates a complementary signal of the output signal;
a controller which is connected to the first sense-amplifying unit and the second sense-amplifying unit, resets the output signal and sets the complementary signal of the output signal in response to a reset signal and an inverted signal of the reset signal; and
a current source which is connected to the first sense-amplifying unit, the second sense-amplifying unit, and the controller and responds to the clock signal; wherein the first sense-amplifying unit comprises:
a first PMOS transistor, wherein a power supply voltage is applied to the source of the first PMOS transistor, the clock signal is applied to the gate of the first PMOS transistor, and the drain of the first PMOS transistor is connected to a first output node from which the output signal is output;
a second PMOS transistor, wherein the power supply voltage is applied to the source of the second PMOS transistor, the complementary signal of the output signal output from the second sense-amplifying unit is applied to the gate of the second PMOS transistor, and the drain of the second PMOS transistor is connected to the first output node;
a first NMOS transistor, wherein the drain of the first NMOS transistor is connected to the first output node, the complementary signal of the output signal is applied to the gate of the first NMOS transistor, and the source of the first NMOS transistor is connected to the controller;
a second NMOS transistor, wherein the drain of the second NMOS transistor is connected to the first output node, the complementary signal of the output signal is applied to the gate of the second NMOS transistor, and the source of the second NMOS transistor is connected to the current source; and
a third NMOS transistor, wherein the drain of the third NMOS transistor is connected to the source of the first NMOS transistor, the input signal is applied to the gate of the third NMOS transistor, and the source of the third NMOS transistor is connected to the controller.

18. The sense amplifier of claim 17, further comprising:
a first inverting buffer which buffers and inverts the output signal; and
a second inverting buffer which buffers and inverts the complementary signal of the output signal.

19. A sense amplifier comprising:
a first sense-amplifying unit which sense-amplifies an input signal in response to a clock signal and a reset signal and generates an output signal;
a second sense-amplifying unit which sense-amplifies a complementary signal of the input signal in response to the clock signal and the reset signal and generates a complementary signal of the output signal;
a first controller which is connected to the first sense-amplifying unit and sets the output signal in response to the reset signal and an inverted signal of the reset signal; and
a second controller which is connected to the second sense-amplifying unit and resets the complementary signal of the output signal in response to the reset signal and the inverted signal of the reset signal.

20. The sense amplifier of claim 19, further comprising:
a first inverting buffer which buffers and inverts the output signal; and
a second inverting buffer which buffers and inverts the complementary signal of the output signal.

21. The sense amplifier of claim 19, wherein the first sense-amplifying unit comprises:
a first PMOS transistor, wherein a power supply voltage is applied to the source of the first PMOS transistor, and the clock signal is applied to the gate of the first PMOS transistor;
a second PMOS transistor, wherein the source of the second PMOS transistor is connected to the drain of the first NMOS transistor, the reset signal is applied to the gate of the second PMOS transistor, and the drain of the second PMOS transistor is connected to a first output node from which the output signal is output;

a third PMOS transistor, wherein the power supply voltage is applied to the source of the third PMOS transistor, the complementary signal of the output signal output from the second sense-amplifying unit is applied to the gate of the third PMOS transistor, and the drain of the third PMOS transistor is connected to the first output node;

a first NMOS transistor, wherein the drain of the first NMOS transistor is connected to the first output node, the complementary signal of the output signal is applied to the gate of the first NMOS transistor, and the source of the first NMOS transistor is connected to the first controller;

a second NMOS transistor, wherein the drain of the second NMOS transistor is connected to the first output node, the complementary signal of the output signal is applied to the gate of the second NMOS transistor, and the source of the second NMOS transistor is connected to the current source; and a third NMOS transistor, wherein the drain of the third NMOS transistor is connected to the source of the first NMOS transistor, the input signal is applied to the gate of the third NMOS transistor, and the source of the third NMOS transistor is connected to the first controller.

22. The sense amplifier of claim 19, wherein the second sense-amplifying unit comprises:
a first PMOS transistor, wherein a power supply voltage is applied to the source of the first PMOS transistor, and the clock signal is applied to the gate of the first PMOS transistor;

a second PMOS transistor, wherein the source of the second PMOS transistor is connected to the drain of the first PMOS transistor, the reset signal is applied to the gate of the second PMOS transistor, and the drain of the second PMOS transistor is connected to a second output node from which the complementary signal of the output signal is output;

a third PMOS transistor, wherein the power supply voltage is applied to the source of the third PMOS transistor, the output signal output from the first sense-amplifying unit is applied to the gate of the third PMOS transistor, and the drain of the third PMOS transistor is connected to the second output node;

a first NMOS transistor, wherein the drain of the first NMOS transistor is connected to the second output node, the output signal is applied to the gate of the first NMOS transistor, and the source of the first NMOS transistor is connected to the second controller;

a second NMOS transistor, wherein the drain of the second NMOS transistor is connected to the second output node, the output signal is applied to the gate of the second NMOS transistor, and the source of the second NMOS transistor is connected to the current source; and a third NMOS transistor, wherein the drain of the third NMOS transistor is connected to the source of the first NMOS transistor, the complementary signal of the input signal is applied to the gate of the third NMOS transistor, and the source of the third NMOS transistor is connected to the second controller.

23. The sense amplifier of claim 19, wherein the first controller comprises:
a first NMOS transistor, wherein the drain of the first NMOS transistor is connected to the first sense-amplifying unit, the inverted signal of the reset signal is applied to the gate of the first NMOS transistor, and the source of the first NMOS transistor is connected to the current source; and a second NMOS transistor, wherein the drain of the second NMOS transistor is connected to the first sense-amplifying unit, the reset signal is applied to the gate of the second NMOS transistor, and the power supply voltage is applied to the source of the second NMOS transistor.

24. The sense amplifier of claim 19, wherein the second controller comprises:
a first NMOS transistor, wherein the drain of the first NMOS transistor is connected to the second sense-amplifying unit, the inverted signal of the reset signal is applied to the gate of the first NMOS transistor, and the source of the first NMOS transistor is connected to the current source; and a second NMOS transistor, wherein the drain of the second NMOS transistor is connected to the second sense-amplifying unit, the reset signal is applied to the gate of the second NMOS transistor, and the ground voltage is applied to the source of the second NMOS transistor.

25. The sense amplifier of claim 19, wherein the current source includes an NMOS transistor, wherein the drain of the NMOS transistor is commonly connected to the first sense-amplifying unit, the second sense-amplifying unit, the first controller, and the second controller, and the clock signal is applied to the gate of the NMOS transistor, and the ground voltage is applied to the source of the NMOS transistor.

26. A sense amplifier comprising:
a first sense-amplifying unit which sense-amplifies an input signal in response to a clock signal and a reset signal and generates an output signal;

a second sense-amplifying unit which sense-amplifies a complementary signal of the input signal in response to the clock signal and the reset signal and generates a complementary signal of the output signal;

a first controller which is connected to the first sense-amplifying unit and resets the output signal in response to the reset signal and an inverted signal of the reset signal; and a second controller which is connected to the second sense-amplifying unit and sets the complementary signal of the output signal in response to the reset signal and the inverted signal of the reset signal.

27. The sense amplifier of claim 26, further comprising:
a first inverting buffer which buffers and inverts the output signal; and a second inverting buffer which buffers and inverts the complementary signal of the output signal.

28. The sense amplifier of claim 26, wherein the first sense-amplifying unit comprises:
a first PMOS transistor, wherein a power supply voltage is applied to the source of the first PMOS transistor, and the clock signal is applied to the gate of the first PMOS transistor;

a second PMOS transistor, wherein the source of the second PMOS transistor is connected to the drain of the first NMOS transistor, the reset signal is applied to the gate of the second PMOS transistor, and the drain of the second PMOS transistor is connected to a first output node from which the output signal is output;

a third PMOS transistor, wherein the power supply voltage is applied to the source of the third PMOS transistor, the complementary signal of the output signal output from the second sense-amplifying unit is applied to the gate of the third PMOS transistor, and the drain of the third PMOS transistor is connected to the first output node;

a first NMOS transistor, wherein the drain of the first NMOS transistor is connected to the first output node, the complementary signal of the output signal is applied to the gate of the first NMOS transistor, and the source of the first NMOS transistor is connected to the first controller;

a second NMOS transistor, wherein the drain of the second NMOS transistor is connected to the first output node, the complementary signal of the output signal is applied to the gate of the second NMOS transistor, and the source of the second NMOS transistor is connected to the current source; and a third NMOS transistor, wherein the drain of the third NMOS transistor is connected to the source of the first NMOS transistor, the input signal is applied to the gate of the third NMOS transistor, and the source of the third NMOS transistor is connected to the first controller.

29. The sense amplifier of claim 26, wherein the second sense-amplifying unit comprises:

a first PMOS transistor, wherein a power supply voltage is applied to the source of the first PMOS transistor, and the clock signal is applied to the gate of the first PMOS transistor;

a second PMOS transistor, wherein the source of the second PMOS transistor is connected to the drain of the first PMOS transistor, the reset signal is applied to the gate of the second PMOS transistor, and the drain of the second PMOS transistor is connected to a second output node from which the complementary signal of the output signal is output;

a third PMOS transistor, wherein the power supply voltage is applied to the source of the third PMOS transistor, the output signal output from the first sense-amplifying unit is applied to the gate of the third PMOS transistor, and the drain of the third PMOS transistor is connected to the second output node;

a first NMOS transistor, wherein the drain of the first NMOS transistor is connected to the second output node, the output signal is applied to the gate of the first NMOS transistor, and the source of the first NMOS transistor is connected to the second controller;

a second NMOS transistor, wherein the drain of the second NMOS transistor is connected to the second output node, the output signal is applied to the gate of the second NMOS transistor, and the source of the second NMOS transistor is connected to the current source; and a third NMOS transistor, wherein the drain of the third NMOS transistor is connected to the source of the first NMOS transistor, the complementary signal of the input signal is applied to the gate of the third NMOS transistor, and the source of the third NMOS transistor is connected to the second controller.

30. The sense amplifier of claim 26, wherein the first controller comprises:

a first NMOS transistor, wherein the drain of the first NMOS transistor is connected to the first sense-amplifying unit, the inverted signal of the reset signal is applied to the gate of the first NMOS transistor, and the source of the first NMOS transistor is connected to the current source; and a second NMOS transistor, wherein the drain of the second NMOS transistor is connected to the first sense-amplifying unit, the reset signal is applied to the gate of the second NMOS transistor, and the ground voltage is applied to the source of the second NMOS transistor.

31. The sense amplifier of claim 26, wherein the second controller comprises:

a first NMOS transistor, wherein the drain of the first NMOS transistor is connected to the second sense-amplifying unit, the inverted signal of the reset signal is applied to the gate of the first NMOS transistor, and the source of the first NMOS transistor is connected to the current source; and a second NMOS transistor, wherein the drain of the second NMOS transistor is connected to the second sense-amplifying unit, the reset signal is applied to the gate of the second NMOS transistor, and the power supply voltage is applied to the source of the second NMOS transistor.

32. The sense amplifier of claim 26, wherein the current source includes an NMOS transistor, wherein the drain of the NMOS transistor is commonly connected to the first sense-amplifying unit, the second sense-amplifying unit, the first controller, and the second controller, and the clock signal is applied to the gate of the NMOS transistor, and the ground voltage is applied to the source of the NMOS transistor.

33. A sense amplifier comprising:

a first sense-amplifying unit which sense-amplifies an input signal in response to a clock signal and a reset signal and generates an output signal;

a second sense-amplifying unit which sense-amplifies a complementary signal of the input signal in response to the clock signal and the reset signal and generates a complementary signal of the output signal; and a controller which is connected to the first sense-amplifying unit and the second sense-amplifying unit, sets the output signal and resets the complementary signal of the output signal in response to the reset signal and an inverted signal of the reset signal; wherein the first sense-amplifying unit comprises:

a first PMOS transistor, wherein a power supply voltage is applied to the source of the first PMOS transistor, and the clock signal is applied to the gate of the first PMOS transistor;

a second PMOS transistor, wherein the source of the second PMOS transistor is connected to the drain of the first PMOS transistor, the reset signal is applied to the gate of the second PMOS transistor, and the drain of the second PMOS transistor is connected to a first output node from which the output signal is output;

a third PMOS transistor, wherein the power supply voltage is applied to the source of the third PMOS transistor, the complementary signal of the output signal output from the second sense-amplifying unit is applied to the gate of the third PMOS transistor, and the drain of the third PMOS transistor is connected to the first output node;

a first NMOS transistor, wherein the drain of the first NMOS transistor is connected to the first output node, the complementary signal of the output signal is applied to the gate of the first NMOS transistor, and the source of the first NMOS transistor is connected to the controller;

a second NMOS transistor, wherein the drain of the second NMOS transistor is connected to the first output node, the complementary signal of the output signal is applied to the gate of the second NMOS transistor, and the source of the second NMOS transistor is connected to the current source; and a third NMOS transistor, wherein the drain of the third NMOS transistor is connected to the source of the first NMOS transistor, the input signal is applied to the gate of the third NMOS transistor, and the source of the third NMOS transistor is connected to the controller.

34. The sense amplifier of claim 33, further comprising:
a first inverting buffer which buffers and inverts the output signal; and
a second inverting buffer which buffers and inverts the complementary signal of the output signal.

35. The sense amplifier of claim 33, further comprising a current source including an NMOS transistor, wherein the drain of the NMOS transistor is commonly connected to the controller, the clock signal is applied to the gate of the NMOS transistor, and the ground voltage is applied to the source of the NMOS transistor.

36. A sense amplifier comprising:
a first sense-amplifying unit which sense-amplifies an input signal in response to a clock signal and a reset signal and generates an output signal;
a second sense-amplifying unit which sense-amplifies a complementary signal of the input signal in response to the clock signal and the reset signal and generates a complementary signal of the output signal; and
a controller which is connected to the first sense-amplifying unit and the second sense-amplifying unit, resets the output signal and sets the complementary signal of the output signal in response to the reset signal and an inverted signal of the reset signal; wherein the first sense-amplifying unit comprises:
a first PMOS transistor, wherein a power supply voltage is applied to the source of the first PMOS transistor, and the clock signal is applied to the gate of the first PMOS transistor;
a second PMOS transistor, wherein the source of the second PMOS transistor is connected to the drain of the first PMOS transistor, the reset signal is applied to the gate of the second PMOS transistor, and the drain of the second PMOS transistor is connected to a first output node from which the output signal is output;
a third PMOS transistor, wherein the power supply voltage is applied to the source of the third PMOS transistor, the complementary signal of the output signal output from the second sense-amplifying unit is applied to the gate of the third PMOS transistor, and the drain of the third PMOS transistor is connected to the first output node;
a first NMOS transistor, wherein the drain of the first NMOS transistor is connected to the first output node, the complementary signal of the output signal is applied to the gate of the first NMOS transistor, and the source of the first NMOS transistor is connected to the controller;
a second NMOS transistor, wherein the drain of the second NMOS transistor is connected to the first output node, the complementary signal of the output signal is applied to the gate of the second NMOS transistor, and the source of the second NMOS transistor is connected to the current source; and
a third NMOS transistor, wherein the drain of the third NMOS transistor is connected to the source of the first NMOS transistor, the input signal is applied to the gate of the third NMOS transistor, and the source of the third NMOS transistor is connected to the controller.

37. The sense amplifier of claim 36, further comprising:
a first inverting buffer which buffers and inverts the output signal; and
a second inverting buffer which buffers and inverts the complementary signal of the output signal.

38. The sense amplifier of claim 36, further comprising a current source including an NMOS transistor, wherein the drain of the NMOS transistor is commonly connected to the controller, the clock signal is applied to the gate of the NMOS transistor, and the ground voltage is applied to the source of the NMOS transistor.

39. A sense amplifier comprising:
a first sense-amplifying unit which sense-amplifies an input signal in response to a clock signal and a reset signal and generates an output signal;
a second sense-amplifying unit which sense-amplifies a complementary signal of the input signal in response to the clock signal and the reset signal and generates a complementary signal of the output signal; and
a controller which is connected to the first sense-amplifying unit and the second sense-amplifying unit, sets the output signal and resets the complementary signal of the output signal in response to the reset signal and an inverted signal of the reset signal; wherein the second
sense-amplifying unit comprises:
a first PMOS transistor, wherein a power supply voltage is applied to the source of the first PMOS transistor, and the clock signal is applied to the gate of the first PMOS transistor;
a second PMOS transistor, wherein the source of the second PMOS transistor is connected to the drain of the first PMOS transistor, the reset signal is applied to the gate of the second PMOS transistor, and the drain of the second PMOS transistor is connected to a second output node from which the complementary signal of the output signal is output;
a third PMOS transistor, wherein the power supply voltage is applied to the source of the third PMOS transistor, the output signal output from the first sense-amplifying unit is applied to the gate of the third PMOS transistor, and the drain of the third PMOS transistor is connected to the second output node;
a first NMOS transistor, wherein the drain of the first NMOS transistor is connected to the second output node, the output signal is applied to the gate of the first NMOS transistor, and the source of the first NMOS transistor is connected to the controller;
a second NMOS transistor, wherein the drain of the second NMOS transistor is connected to the second output node, the output signal is applied to the gate of the second NMOS transistor, and the source of the second NMOS transistor is connected to the current source; and
a third NMOS transistor, wherein the drain of the third NMOS transistor is connected to the source of the first NMOS transistor, the complementary signal of the input signal is applied to the gate of the third NMOS transistor, and the source of the third NMOS transistor is connected to the controller.

40. A sense amplifier comprising:
a first sense-amplifying unit which sense-amplifies an input signal in response to a clock signal and a reset signal and generates an output signal;
a second sense-amplifying unit which sense-amplifies a complementary signal of the input signal in response to the clock signal and the reset signal and generates a complementary signal of the output signal; and a controller which is connected to the first sense-amplifying unit and the second sense-amplifying unit, sets the output signal and resets the complementary signal of the output signal in response to the reset signal and an inverted signal of the reset signal; wherein the controller comprises:

a first NMOS transistor, wherein the drain of the first NMOS transistor is connected to the first sense-amplifying unit, the reset signal is applied to the gate of the first NMOS transistor, and the power supply voltage is applied to the source of the first NMOS transistor;

a second NMOS transistor, wherein the drain of the second NMOS transistor is connected to the second sense-amplifying unit, the reset signal is applied to the gate of the second NMOS transistor, and the ground voltage is applied to the source of the second NMOS transistor; and a third NMOS transistor, wherein the drain of the third NMOS transistor is commonly connected to the first sense-amplifying unit and the second sense-amplifying unit, and the inversion reset signal of the reset signal is applied to the gate of the third NMOS transistor.

41. A sense amplifier comprising:

a first sense-amplifying unit which sense-amplifies an input signal in response to a clock signal and a reset signal and generates an output signal;

a second sense-amplifying unit which sense-amplifies a complementary signal of the input signal in response to the clock signal and the reset signal and generates a complementary signal of the output signal; and a controller which is connected to the first sense-amplifying unit and the second sense-amplifying unit, resets the output signal and sets the complementary signal of the output signal in response to the reset signal and an inverted signal of the reset signal, wherein the second sense-amplifying unit comprises:

a first PMOS transistor, wherein a power supply voltage is applied to the source of the first PMOS transistor, and the clock signal is applied to the gate of the first PMOS transistor;

a second PMOS transistor, wherein the source of the second PMOS transistor is connected to the drain of the first PMOS transistor, the reset signal is applied to the gate of the second PMOS transistor, and the drain of the second PMOS transistor is connected to a second output node from which the complementary signal of the output signal is output;

a third PMOS transistor, wherein the power supply voltage is applied to the source of the third PMOS transistor, the output signal output from the first sense-amplifying unit is applied to the gate of the third PMOS transistor, and the drain of the third PMOS transistor is connected to the second output node;

a first NMOS transistor, wherein the drain of the first NMOS transistor is connected to the second output node, the output signal is applied to the gate of the first NMOS transistor, and the source of the first NMOS transistor is connected to the controller;

a second NMOS transistor, wherein the drain of the second NMOS transistor is connected to the second output node, the output signal is applied to the gate of the second NMOS transistor, and the source of the second NMOS transistor is connected to the current source; and a third NMOS transistor, wherein the drain of the third NMOS transistor is connected to the source of the first NMOS transistor, the complementary signal of the input signal is applied to the gate of the third NMOS transistor, and the source of the third NMOS transistor is connected to the controller.

42. A sense amplifier comprising:

a first sense-amplifying unit which sense-amplifies an input signal in response to a clock signal and a reset signal and generates an output signal;

a second sense-amplifying unit which sense-amplifies a complementary signal of the input signal in response to the clock signal and the reset signal and generates a complementary signal of the output signal; and a controller which is connected to the first sense-amplifying unit and the second sense-amplifying unit, resets the output signal and sets the complementary signal of the output signal in response to the reset signal and an inverted signal of the reset signal; wherein the controller comprises:

a first NMOS transistor, wherein the drain of the first NMOS transistor is connected to the first sense-amplifying unit, the reset signal is applied to the gate of the first NMOS transistor, and the ground voltage is applied to the source of the first NMOS transistor;

a second NMOS transistor, wherein the drain of the second NMOS transistor is connected to the second sense-amplifying unit, the reset signal is applied to the gate of the second NMOS transistor, and the power supply voltage is applied to the source of the second NMOS transistor; and a third NMOS transistor, wherein the drain of the third NMOS transistor is commonly connected to the first sense-amplifying unit and the second sense-amplifying unit, and the inverted signal of the reset signal is applied to the gate of the third NMOS transistor.

43. A sense amplifier comprising:

a first sense-amplifying unit which sense-amplifies an input signal in response to a clock signal and generates an output signal;

a second sense-amplifying unit which sense-amplifies a complementary signal of the input signal in response to the clock signal and generates the complementary signal of the output signal;

a controller which is connected to the first sense-amplifying unit and the second sense-amplifying unit, sets the output signal and resets the complementary signal of the output signal in response to a reset signal and an inverted signal of the reset signal; and a current source which is connected to the first sense-amplifying unit, the second sense-amplifying unit, and the controller and responds to the clock signal; wherein the second sense-amplifying unit comprises:

a first PMOS transistor, wherein a power supply voltage is applied to the source of the first PMOS transistor, the clock signal is applied to the gate of the first PMOS transistor, and the drain of the first PMOS transistor is connected to a second output node from which the complementary signal of the output signal is output;

a second PMOS transistor, wherein the power supply voltage is applied to the source of the second PMOS transistor, the output signal output from the first sense-amplifying unit is applied to the gate of the second PMOS transistor, and the drain of the second PMOS transistor is connected to the second output node;

a first NMOS transistor, wherein the drain of the first NMOS transistor is connected to the second output node, the output signal is applied to the gate of the first NMOS transistor, and the source of the first NMOS transistor is connected to the controller;
a second NMOS transistor, wherein the drain of the second NMOS transistor is connected to the second output node, the output signal is applied to the gate of the second NMOS transistor, and the source of the second NMOS transistor is connected to the current source; and
a third NMOS transistor, wherein the drain of the third NMOS transistor is connected to the source of the first NMOS transistor, the complementary signal of the input signal is applied to the gate of the third NMOS transistor, and the source of the third NMOS transistor is connected to the controller.

44. A sense amplifier comprising:
a first sense-amplifying unit which sense-amplifies an input signal in response to a clock signal and generates an output signal;
a second sense-amplifying unit which sense-amplifies a complementary signal of the input signal in response to the clock signal and generates the complementary signal of the output signal;
a controller which is connected to the first sense-amplifying unit and the second sense-amplifying unit, sets the output signal and resets the complementary signal of the output signal in response to a reset signal and an inverted signal of the reset signal; and
a current source which is connected to the first sense-amplifying unit, the second sense-amplifying unit, and the controller and responds to the clock signal; wherein the controller comprises:
a first NMOS transistor, wherein the drain of the first NMOS transistor is connected to the first sense-amplifying unit, and the ground voltage is applied to the gate of the first NMOS transistor;
a second NMOS transistor, wherein the drain of the second NMOS transistor is connected to the second sense-amplifying unit, and the power supply voltage is applied to the gate of the second NMOS transistor;
a third NMOS transistor, wherein the drain of the third NMOS transistor is commonly connected to the source of the first NMOS transistor and the source of the second NMOS transistor, the reset signal is applied to the gate of the third NMOS transistor, and the source of the third NMOS transistor is connected to the current source; and
a fourth NMOS transistor, wherein the drain of the fourth NMOS transistor is commonly connected to the first sense-amplifying unit and the second sense-amplifying unit, the inversion reset signal is applied to the gate of the fourth NMOS transistor, and the source of the fourth NMOS transistor is connected to the current source.

45. A sense amplifier comprising:
a first sense-amplifying unit which sense-amplifies an input signal in response to a clock signal and generates an output signal;
a second sense-amplifying unit which sense-amplifies a complementary signal of the input signal in response to the clock signal and generates the complementary signal of the output signal;
a controller which is connected to the first sense-amplifying unit and the second sense-amplifying unit, sets the output signal and resets the complementary signal of the output signal in response to a reset signal and an inverted signal of the reset signal; and
a current source which is connected to the first sense-amplifying unit, the second sense-amplifying unit, and the controller and responds to the clock signal; wherein the current source includes an NMOS transistor, wherein the drain of the NMOS transistor is commonly connected to the first sense-amplifying unit, the second sense-amplifying unit, and the controller, and the clock signal is applied to the gate of the NMOS transistor, and the ground voltage is applied to the source of the NMOS transistor.

46. A sense amplifier comprising:
a first sense-amplifying unit which sense-amplifies an input signal in response to a clock signal and generates an output signal;
a second sense-amplifying unit which sense-amplifies a complementary signal of the input signal in response to the clock signal and generates a complementary signal of the output signal;
a controller which is connected to the first sense-amplifying unit and the second sense-amplifying unit, resets the output signal and sets the complementary signal of the output signal in response to a reset signal and an inverted signal of the reset signal; and
a current source which is connected to the first sense-amplifying unit, the second sense-amplifying unit, and the controller and responds to the clock signal; wherein the second sense-amplifying unit comprises:
a first PMOS transistor, wherein a power supply voltage is applied to the source of the first PMOS transistor, the clock signal is applied to the gate of the first PMOS transistor, and the drain of the first PMOS transistor is connected to a second output node from which the complementary signal of the output signal is output;
a second PMOS transistor, wherein the power supply voltage is applied to the source of the second PMOS transistor, the output signal output from the first sense-amplifying unit is applied to the gate of the second PMOS transistor, and the drain of the second PMOS transistor is connected to the second output node;
a first NMOS transistor, wherein the drain of the first NMOS transistor is connected to the second output node, the output signal is applied to the gate of the first NMOS transistor, and the source of the first NMOS transistor is connected to the controller;
a second NMOS transistor, wherein the drain of the second NMOS transistor is connected to the second output node, the output signal is applied to the gate of the second NMOS transistor, and the source of the second NMOS transistor is connected to the current source; and
a third NMOS transistor, wherein the drain of the third NMOS transistor is connected to the source of the first NMOS transistor, the complementary signal of the input signal is applied to the gate of the third NMOS transistor, and the source of the third NMOS transistor is connected to the controller.

47. A sense amplifier comprising:
a first sense-amplifying unit which sense-amplifies an input signal in response to a clock signal and generates an output signal;
a second sense-amplifying unit which sense-amplifies a complementary signal of the input signal in response to the clock signal and generates a complementary signal of the output signal;
a controller which is connected to the first sense-amplifying unit and the second sense-amplifying unit, resets the output signal and sets the complementary signal of the output signal in response to a reset signal and an inverted signal of the reset signal; and a current source which is connected to the first sense-amplifying unit, the second sense-amplifying unit, and the controller and responds to the clock signal; wherein the controller comprises:

a first NMOS transistor, wherein the drain of the first NMOS transistor is connected to the first sense-amplifying unit, and the power supply voltage is applied to the gate of the first NMOS transistor;

a second NMOS transistor, wherein the drain of the second NMOS transistor is connected to the second sense-amplifying unit, and the ground voltage is applied to the gate of the second NMOS transistor;

a third NMOS transistor, wherein the drain of the third NMOS transistor is commonly connected to the source of the first NMOS transistor and the source of the second NMOS transistor, the reset signal is applied to the gate of the third NMOS transistor, and the source of the third NMOS transistor is connected to the current source; and a fourth NMOS transistor, wherein the drain of the fourth NMOS transistor is commonly connected to the source of the first NMOS transistor and the source of the second NMOS transistor, the inverted signal of the reset signal is applied to the gate of the fourth NMOS transistor, and the source of the fourth NMOS transistor is connected to the current source.

48. A sense amplifier comprising:

a first sense-amplifying unit which sense-amplifies an input signal in response to a clock signal and generates an output signal;

a second sense-amplifying unit which sense-amplifies a complementary signal of the input signal in response to the clock signal and generates a complementary signal of the output signal;

a controller which is connected to the first sense-amplifying unit and the second sense-amplifying unit, resets the output signal and sets the complementary signal of the output signal in response to a reset signal and an inverted signal of the reset signal; and a current source which is connected to the first sense-amplifying unit, the second sense-amplifying unit, and the controller and responds to the clock signal; wherein the current source includes an NMOS transistor, wherein the drain of the NMOS transistor is commonly connected to the first sense-amplifying unit, the second sense-amplifying unit, and the controller, and the clock signal is applied to the gate of the NMOS transistor, and the ground voltage is applied to the source of the NMOS transistor.

* * * * *